United States Patent [19]
Kakumu

[11] Patent Number: 5,278,430
[45] Date of Patent: Jan. 11, 1994

[54] COMPLEMENTARY SEMICONDUCTOR DEVICE USING DIAMOND THIN FILM AND THE METHOD OF MANUFACTURING THIS DEVICE

[75] Inventor: Masakazu Kakumu, Mountain View, Calif.

[73] Assignee: Kabushiki Kaisha Toshiba, Kawasaki, Japan

[21] Appl. No.: 835,081

[22] Filed: Feb. 18, 1992

Related U.S. Application Data

[63] Continuation of Ser. No. 612,676, Nov. 14, 1990, abandoned.

[30] Foreign Application Priority Data

Nov. 18, 1989 [JP] Japan .................. 1-298765

[51] Int. Cl.$^5$ .................. H01L 27/01; H01L 27/02; H01L 29/161
[52] U.S. Cl. .................. 257/77; 257/22; 257/348; 257/351; 257/476; 257/485; 257/613; 257/925
[58] Field of Search .................. 357/23.1, 23.7, 42, 357/61; 257/22, 51, 66, 77, 288, 347–353, 613, 925, 471, 476, 485

[56] References Cited

U.S. PATENT DOCUMENTS

| | | | |
|---|---|---|---|
| 3,767,984 | 10/1973 | Shinoda et al. | 357/42 |
| 3,964,942 | 6/1976 | Wang | 257/351 |
| 4,389,768 | 6/1983 | Fowler et al. | 437/912 |
| 4,903,089 | 2/1990 | Hollis et al. | 357/22 |
| 4,982,243 | 1/1991 | Nakahata et al. | 357/761 |

FOREIGN PATENT DOCUMENTS

| | | |
|---|---|---|
| 1-158774 | 6/1989 | Japan . |
| 61-68966 | 7/1989 | Japan . |
| 57-106236 | 7/9182 | Japan ............... 357/42 |

*Primary Examiner*—J. Carroll
*Attorney, Agent, or Firm*—Finnegan, Henderson, Farabow, Garrett & Dunner

[57] ABSTRACT

A complementary semiconductor device incorporating semiconductor composed of diamond. Substantially, diamond is insulative. When both III group elementary atoms and V group elementary atoms are doped into diamond, the doped regions respectively turn into p-type and n-type semiconductors. The embodiment discretely dopes both III group elementary atoms and V group elementary atoms into a layer of diamond thin film to eventually form a complementary semiconductor device. The embodiment forms wiring system inside of the diamond thin film by selectively doping either III group elementary atoms or V group elementary atoms therein without forming wiring system only on the inter-layer insulation film.

8 Claims, 6 Drawing Sheets

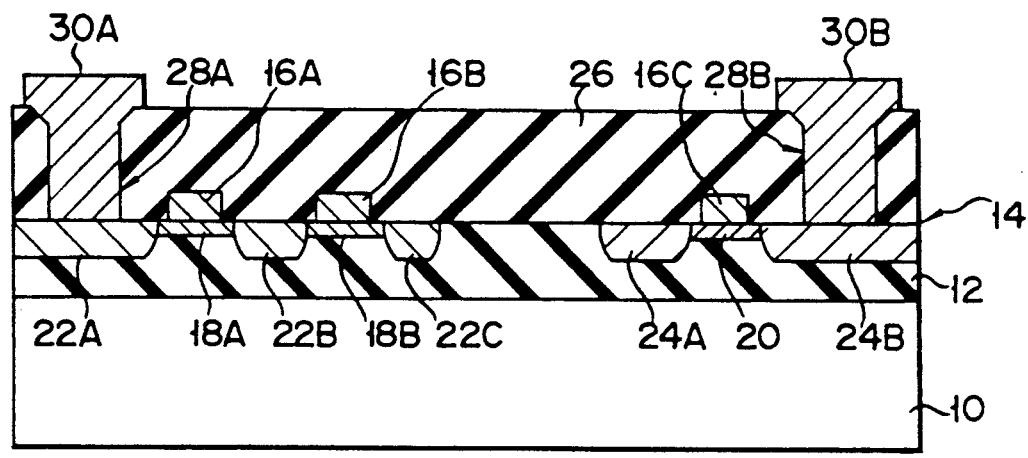
F I G. 1
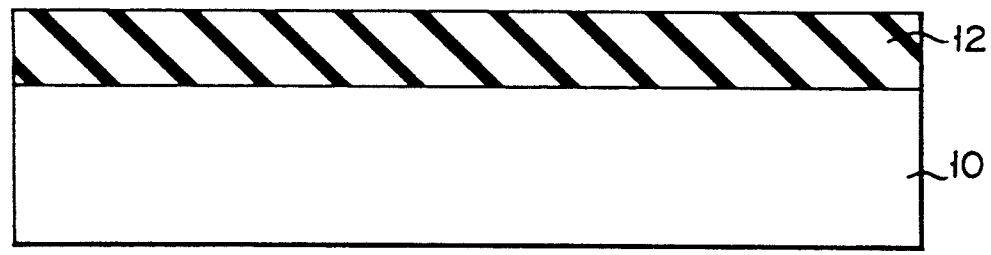
F I G. 2A
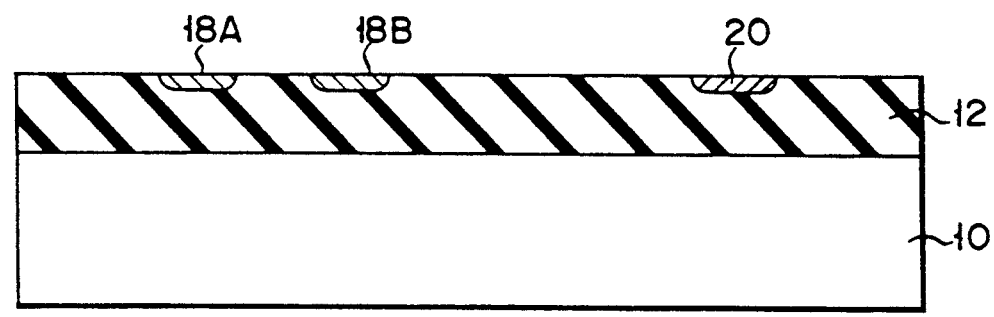
F I G. 2B

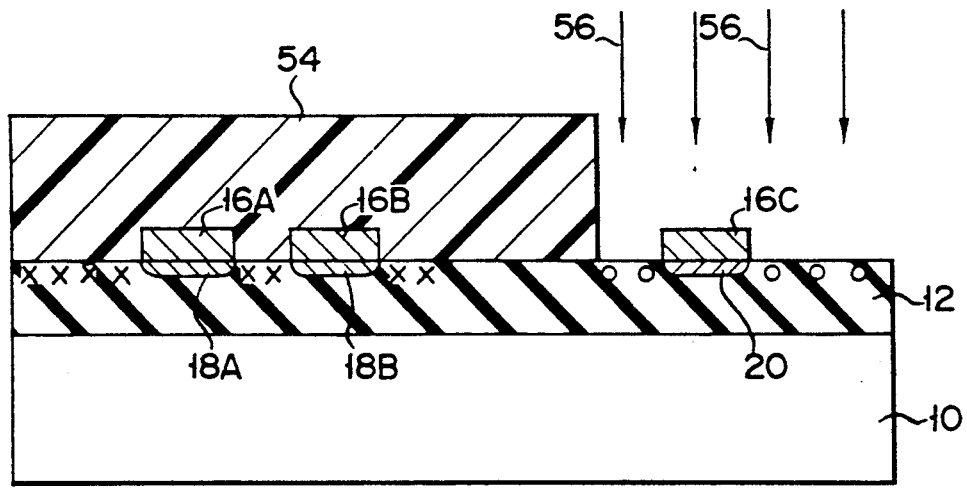
F I G. 2F
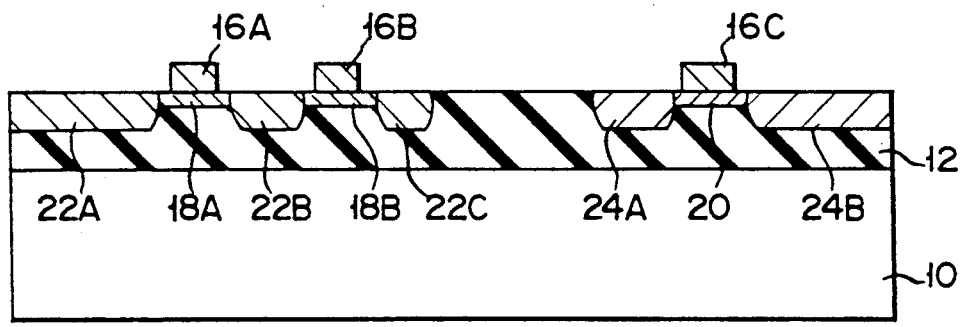
F I G. 2G
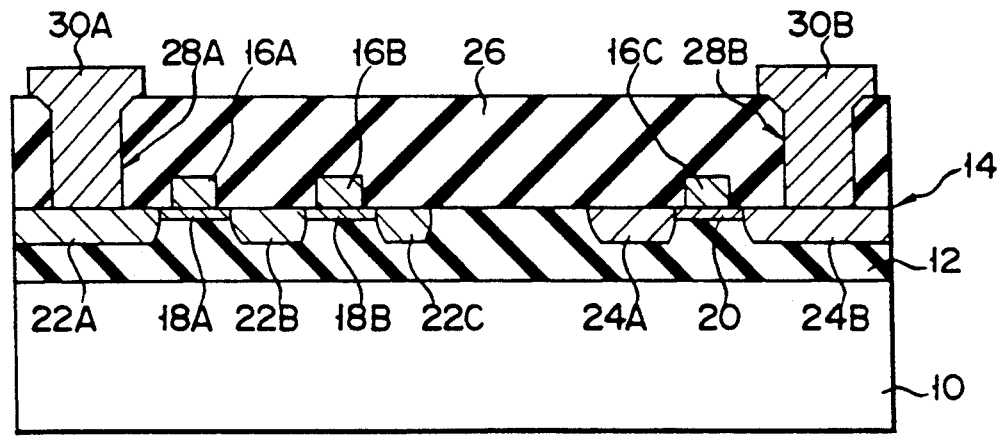
F I G. 2H

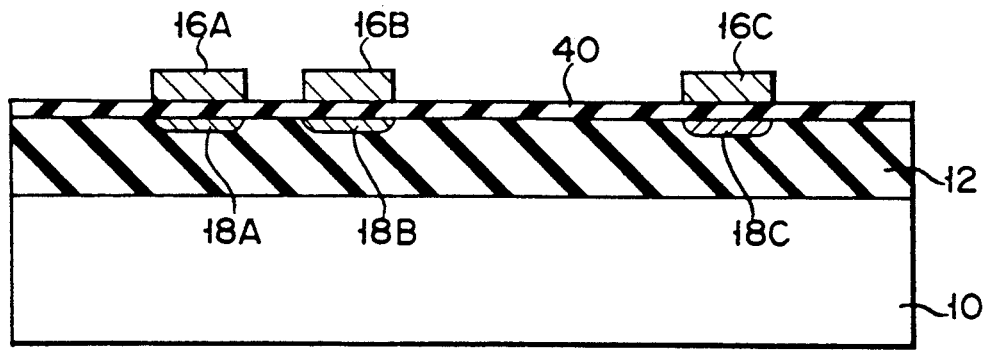
F I G. 4C
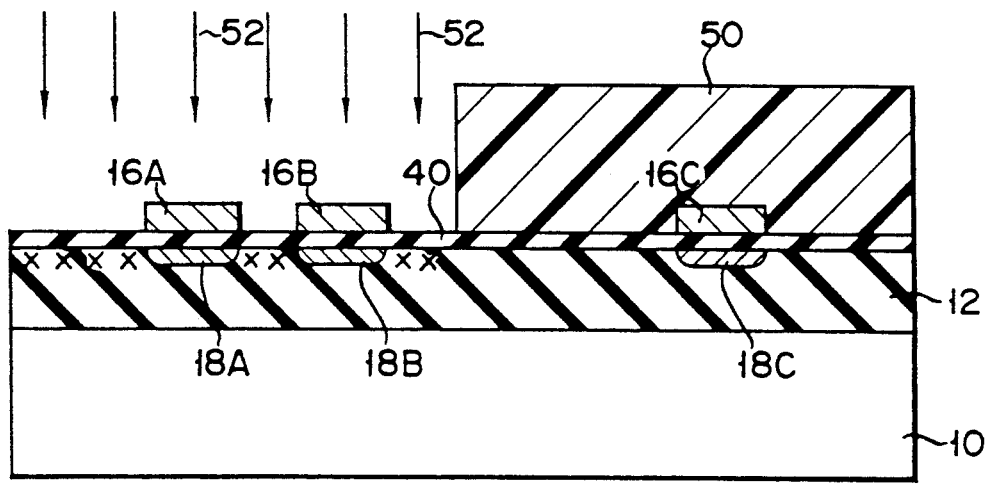
F I G. 4D
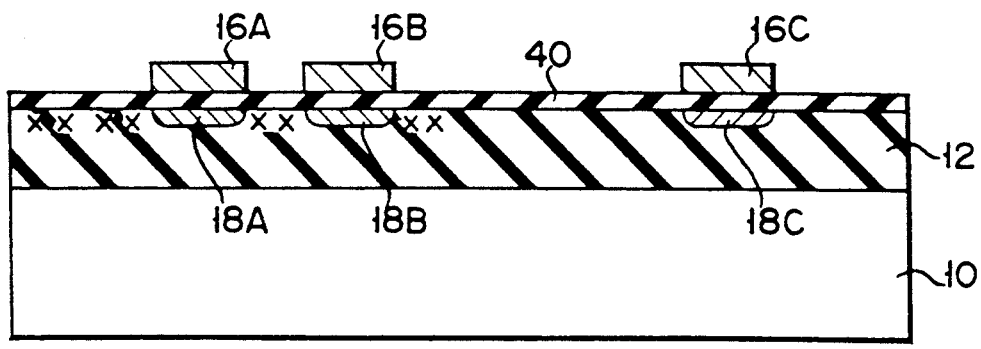
F I G. 4E

COMPLEMENTARY SEMICONDUCTOR DEVICE USING DIAMOND THIN FILM AND THE METHOD OF MANUFACTURING THIS DEVICE

This application is a continuation of now abandoned application Ser. No. 07/612,676, filed Nov. 14, 1990, abandoned.

BACKGROUND OF THE INVENTION

1. Field of the Invention

The present invention relates to a complementary semiconductor device using diamond thin film and to a method of manufacturing this device.

2. Description of the Related Art

Conventionally, complementary semiconductor is made of silicon. Recently, there has been further progress in the integrated density of elements of modern a complementary semiconductor devices, and in addition, extremely fine elements have been very densely integrated in a chip in a rapidly growing number.

Any densely integrated conventional complementary semiconductor device involves a variety of critical problems including the following: The finer the size of the integrated elements, the faster the operating speed of these elements, thus raising frequency. In particular, when high frequency is generated, the device, i.e., the chip itself generates much thermal energy. Power dissipation P is expressed by an equation shown below.

$$P = C \cdot V^2 \cdot n \cdot f \quad (1)$$

where C designates capacitance per element, V the operating voltage, n the number of integrated elements, and f designates operating frequency.

Assume that the size of the integrated elements are vertically and horizontally reduced to one-half the original size without varying the operating voltage V. The capacitance C per element can simply be reduced to one-half, whereas the number of the integrated elements is quadrupled, and the frequency f rises at least more than double. Based on the above equation (1), the power dissipation P grows at least four times.

Incidentally, silicon has about 1.1 eV of the band gap. In order to normally operate a silicon semiconductor device, there is the critical power dissipation of the silicon chip in a package, which is about 85° C. based on conversion into temperature. Even when operating such a package provided with a radiating fan, any conventional silicon semiconductor chip in the package can no longer sustain normal operation at about 100° C. through 120° C. based on the conversion into temperature.

In consequence, based on the physical property inherent to silicon, a critical number of integrated elements is determined for any conventional device using silicon semiconductor.

Likewise, based on the specific dielectric constant inherent to silicon, critical operating speed is determined for any conventional device using a silicon semiconductor.

Since silicon has about 11.7 of permittivity constant, parasitic capacitance such as junction capacitance easily grows.

SUMMARY OF THE INVENTION

The object of the invention is to overcome those problems by providing a novel complementary semiconductor device which can securely materialize higher integration of elements and faster operating speed than those of any conventional complementary semiconductor devices incorporating a silicon semiconductor and also by providing a novel method of manufacturing this novel complementary semiconductor device. These objects can be achieved by embodying the following:

A complementary semiconductor device comprises: a substrate having a major surface; a diamond thin film formed on the major surface of said substrate and having a major surface facing away from said substrate; first and second conductive regions formed in the major surface of said diamond thin film and functioning as channels; a first gate located above said first conductive region; first insulating means for insulating interposed between said first conductive region and said first gate, thus electrically insulating said first conductive region and said first gate from each other; a second gate located above said second conductive region; second insulating means for insulating interposed between said second conductive region and said second gate, thus electrically insulating said second conductive region and said second gate from each other; first source region and first drain region both having a first conductivity type, formed in the major surface of said diamond thin film and contacting said first conductive region; a second source region and a second drain region, both having a second conductivity type, formed in the major surface of said diamond thin film and contacting said second conductive region.

A method of manufacturing the complementary semiconductor device comprises steps of: (a) a step for forming a diamond thin film on a substrate having a main surface; (b) a step for forming the first conductive region by selectively doping the impurity into said diamond thin film; (c) a step for forming the second conductive region by selectively doping the impurity into said diamond thin film; (d) a step for forming the first conductive film on said diamond thin film; (e) a step for forming the first and second gates in correspondence with said first and second conductive regions by selectively etching said first conductive film; (f) a step for forming the first source region and drain region by selectively doping an impurity into said diamond thin film; (g) a step for forming the second source region and drain region by selectively doping an impurity into said diamond thin film; (h) a step for forming an inter-layer insulation film on said device having structure complete with said step (g); (i) a step for forming contact holes connected to specific portions of said device, wherein said contact holes are provided through said inter-layer insulation film; (k) a step for forming the second conductive film on said device having structure complete with said step (i); (l) a step for forming wiring layers by selectively etching said second conductive film.

According to the complementary semiconductor device characterized by the structure described above, since diamond is made available for composing the semiconductor, the calorific value and the parasitic capacitance thus far dependent on the physical constant of silicon can be determined by the physical constant of diamond. As a result, the complementary semiconductor device embodied by the invention can raise the normal operating temperature from the critical temperature of any conventional complementary semiconductor device using silicon.

In consequence, the complementary semiconductor device embodied by the invention allows the power dissipation to rise and the number of elements to increase for integration into a chip beyond the critical range of any conventional complementary semiconductor devices using silicon. Incidentally, diamond has a certain specific dielectric constant lower than that of silicon and provides a certain parasitic capacitance which is quite less than that generated by elements in silicon film.

According to the method of manufacturing the complementary semiconductor device embodied by the invention, the manufacturer can dispense with the process for generating an insulation film conventionally needed for separating elements and the process for forming the well region otherwise needed for forming an opposite conductive active element in the one-way conductive semiconductor. This in turn simplifies the manufacturing process and allows the manufacturer to delete a number of processes.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 illustrates a sectional view of a complementary semiconductor device relating to the first embodiment of the invention;

FIGS. 2A through 2H respectively illustrate sectional views of the complementary semiconductor device of the first embodiment according to the sequence of manufacturing steps;

FIGS. 4A through 4H respectively illustrate sectional views of the complementary semiconductor device under the CVD process of the second embodiment of the invention.

DETAILED DESCRIPTION OF THE PREFERRED EMBODIMENTS

Figure 2C:
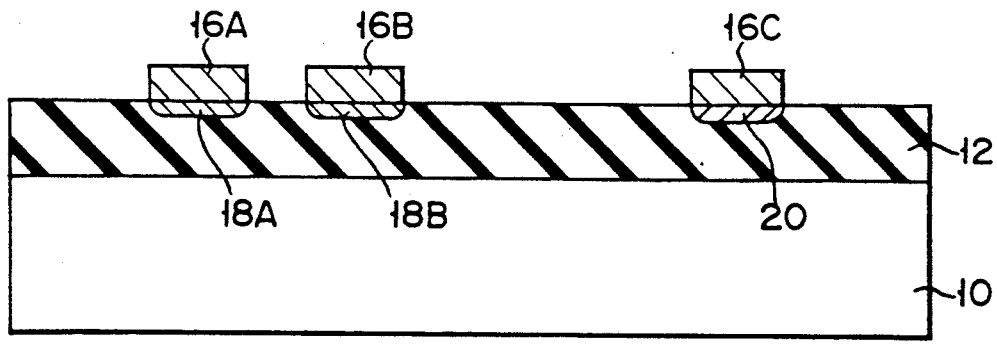

Referring now more particularly to the accompanying drawings, the embodiments of the invention are described below.

[Embodiment 1]

FIG. 1 illustrates the sectional view of the complementary semiconductor device related to the first embodiment of the invention. As shown here, diamond thin film 12 is formed on a silicon substrate 10. Gate electrodes 16A through 16C made from tungsten for example are provided on surface 14 of the diamond thin film 12. N-type channel-forming regions 18A and 18B each containing about $2 \times 10^{16}$ cm$^{-3}$ of a concentration of impurities are formed in the diamond thin film 12 below the gate electrodes 16A and 16B. Likewise, p-type channel-forming region 20 containing about $2 \times 10^{16}$ cm$^{-3}$ of a concentration of impurities is also formed in the diamond thin film 12 below the gate electrode 16C. By doping a maximum of $2 \times 10^{16}$ cm$^{-3}$ of a concentration of impurities into the n-type channel-forming regions 18A and 18B and the p-type channel-forming region 20, gate the of both FETs can be converted into a Schottky junction gate, thus allowing formation of a complementary MESFET device. N-type source/drain regions 22A through 22C are respectively formed in the diamond thin film 12 on the sides of the n-type channel-forming regions 18A and 18B. On the other hand, p-type source/drain regions 24A and 24B are respectively formed in the diamond thin film 12 on the side of the p-type channel-forming region 18C. After source and drain formation, gate electrode material is slightly etched with selectivity to diamond, until a gate electrode is isolated from a highly doped region, such as 22A, 22B, 22C, 24A and 24B. Inter-layer insulation film 26 is formed in the diamond thin film 12 to insulate the gate electrodes 16A through 16C. A contact hole 28A is vertically provided through the inter-layer insulation film 26 in the direction of the n-type source/drain region 22A. Another contact hole 28 is vertically provided in the direction of the p-type source/drain region 24B. Metal wiring layers 30A and 30B composed of aluminium for example are provided on the inter-layer insulation film 26. The metal wiring layer 30A is electrically connected to the n-type source/drain region 22A via the contact hole 28A, whereas the metal wiring layer 30B is electrically connected to the p-type source/drain region 24B via the contact hole 28B.

Since the complementary semiconductor device featuring the above structure uses a semiconductor made from diamond, it facilitates manufacture to integrate a greater number of elements on a chip and operate the device at a faster speed than any conventional complementary semiconductor devices using silicon.

Next, in relation to the physical property of diamond, high-density integration of elements and acceleration of the operating speed of the complementary semiconductor device are described below.

First, the possibility of achieving high-density integration is described below. Power dissipation of the complementary semiconductor device embodied by the invention can be computed by applying the equation (1) shown earlier.

Even if elements were formed in silicon film of in diamond film, mechanism of heat generation is constant. Nevertheless, taking the physical constants of silicon and diamond into account, it is obvious that diamond can materialize integration of elements at a greater density than the other.

Silicon has about 1.1 eV of band gap, whereas diamond has about 5.5 eV of band gap. As is well know, when a thermal effect is applied to a semiconductor, electron-hole pairs are internally generated. In other words, electron-hole pairs can easily be generated in a silicon semiconductor containing less value of the band gap. Because of this reason, by converting the power dissipation into chip temperature, silicon semiconductor devices can normally operate in a range from 85° to a maximum of 120° C. On the other hand, diamond has a band-gap value about 5 times higher than that of silicon. Because of this, thermal electrons can hardly be generated in diamond unlike the case of silicon.

Accordingly, based on the conversion of the power dissipation into chip temperature, it is possible for the diamond-applied complementary semiconductor device of the invention to raise the critical temperature up to about 500° C., at which the device can still maintain normal operation.

In consequence, it is possible for the diamond-applied complementary semiconductor device embodied by the invention to integrate a greater number of elements in a chip than any conventional silicon-applied complementary semiconductor device can afford.

Next, the possibility of achieving accelerated operation is described below. Although faster operation can be achieved by developing elements into still finer sizes, in particular, when comparing the specific dielectric constant between diamond and silicon, it is quite apparent that the diamond-applied complementary semiconductor device can operate at a speed much faster than the silicon-based conventional complementary semiconductor devices.

Silicon has about 11.7 of permittivity constant against about 5.5 of diamond. As is well known, the greater the specific dielectric constant, the greater the junction capacitance, i.e., the parasitic capacitance, and as a result, the semiconductor device cannot operate at a fast speed. Since diamond has the specific dielectric constant which is merely one-half that of silicon, the complementary semiconductor device using diamond contains less parasitic capacitance, and as a result, it can operate at a faster speed. Mobility of holes in diamond is greater than that of silicon and GaAs. Because of this, in particular, p-channel type FET can significantly accelerate its operating speed. Owing to this advantage, the difference of the mobility between electrons and holes can be reduced. And yet, it can further reduce the difference in the performance characteristics between the n-type and p-type FETs. If it is possible for both of the integrated conductive FETs of a complementary semiconductor device to minimize the difference of performance characteristics, performance characteristics of both of these FETs can easily become comparable to each other. This is quite advantageous for the complementary semiconductor devices to materialize more dense integration of component elements.

According to the invention, a complementary semiconductor device is formed in the diamond thin film 12. Furthermore the diamond thin film 12 incorporates a wiring layer generated by doping impurities. This wiring layer is substantially the source/drain region 22B shown in FIG. 1. Substantially, the source/drain region 22B is a diffusion layer which is formed between an FET incorporating the gate electrode 16A and another FET incorporating the gate electrode 16B. This diffusion layer serves as drainage for one of these FETs and concurrently serves as source for the other FET. In other words, this wiring system connects both the n-type and p-type FETs to each other.

In this way, by providing wiring in the diamond thin film 12, the complementary semiconductor device of the invention forms a three-dimensional wiring structure comprising metal wiring layers 30A and 30B on the interlayer insulation film 26, thus achieving such a wiring structure ideally suited for facilitating integration of elements into the semiconductor device at closer density.

In addition to those wiring examples shown in FIG. 1, it is also possible for the embodiment to form the predetermined wiring pattern by applying photo-engraving process with photoresist and then provide wiring pattern by doping into the diamond thin film 12 by applying the masking effect of the printed wiring pattern. Compared to the provision of the wiring in a silicon semiconductor, less parasitic capacitance occurs in the wiring formed by the doping of impurities in the diamond thin film 12. Because of this, it is ideally suited for transmitting a signal at a fast speed.

The complementary semiconductor device formed in the insulative diamond thin film 12 dispenses with provision of element-separating region and the well region. Furthermore, compared to the formation of a complementary semiconductor device inside of GaAs substrate, since the diamond-applied complementary semiconductor device of the invention can reduce the difference of the mobility of electrons and holes, both the n-channel and p-channel type FETs can minimize the difference of performance characteristics.

Next, referring now to FIGS. 2A through 2H, the preferred method of manufacturing the complementary semiconductor device related to the first embodiment is described below. FIG. 2A through 2H respectively illustrate the sectional views of the complementary semiconductor device of the first embodiment according to the sequence of manufacturing processes. Those components shown in FIGS. 2A through 2H identical to those which are shown in FIG. 1 are designated by the identical reference numerals.

As shown FIG. 2A, first, by applying the microwave plasma CVD process for example, the diamond thin film 12 is brought under propagation on a silicon substrate 10 until reaching the predetermined thickness.

Next, as shown in FIG. 2B, by applying a photo-engraving process for example, n-type impurities like ionized antimony for example are selectively doped into the diamond thin film 12 by applying 150 KeV of accelerated voltage and $1 \times 10^{11}$ cm$^{-2}$ of the dosed amount. Next, p-type impurities matter like ionized boron for example are also doped into the diamond thin film 12 by applying 100 KeV of accelerated voltage and $1 \times 10^{11}$ cm$^{-2}$ of the dosed amount. Next, the diamond thin film 12 is thermally processed at about 400° C., and then n-type channel-forming regions 18A and 18B containing about $2 \times 10^{16}$ cm$^{-3}$ of the concentration of impurities and also p-type channel-forming region 20 containing about $2 \times 10^{16}$ cm$^{-3}$ of the concentration of impurities are respectively formed.

It is suggested that, after completing those sequential processes mentioned above, selected ionized impurities may also be doped into the n-type and p-type channel-forming regions 18A, 18B, and 20 for controlling threshold value.

Next, as shown in FIG. 2C, by applying the CVD process for example, tungsten for example is deposited on the entire surface. Next, the tungsten film is selectively etched by applying a photo-engraving process for example, and then gate electrodes 16A through 16C are formed.

Figure 2D:
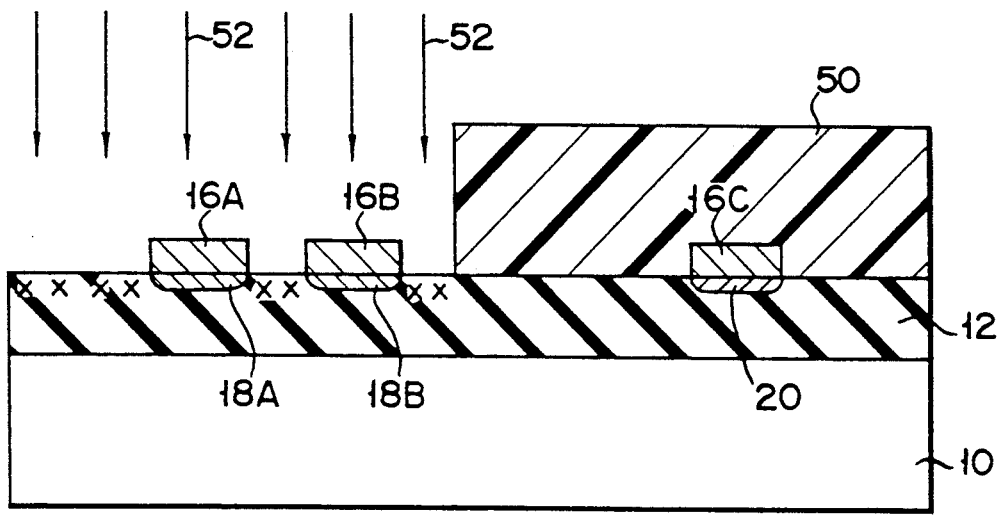

Next, as shown in FIG. 2D, using photoresist 50, p-type FET forming region is masked. Next, by masking the photoresist 50 and the gate electrodes 16A and 16B, selected impurities like antimony 52 are doped into the diamond thin film 12 by applying 50 KeV of accelerated voltage and $5 \times 10^{15}$ cm$^{-2}$ of the dosed amount.

Figure 2E:
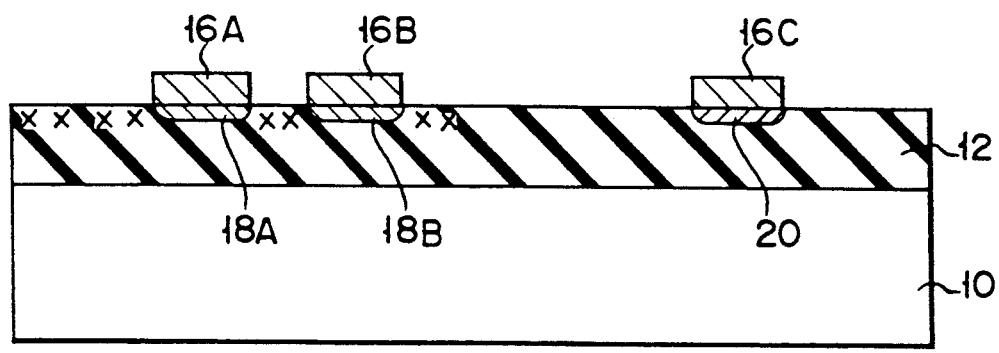

Next, as shown in FIG. 2E, the photoresist 50 is removed. Next, as shown in FIG. 2F, using photoresist 54 for example, n-channel type FET forming region is masked. Next, the photoresist 54 and the gate electrode 16C are respectively masked before doping boron for example into the diamond thin film 12 by applying 20 KeV of accelerated voltage and $5 \times 10^{15}$ cm$^{-2}$ of the dosed amount.

Next, as shown in FIG. 2G, after removal of photo resist 54, tungsten gate electrodes 16A, 16B and 16C are etched in CF$_4$+O$_2$ gas ambient in order to them isolate from highly implanted areas, such as 22A, 22B, 22C, 24A and 24B. This process needs high selectivity between gate electrode film and diamond during etching. Next, the diamond thin film 12 is thermally processed at a minimum of 400° C. to activate the impurities doped in the diamond thin film 12 before eventually forming n-type source/drain regions 22A through 22C each containing about $1 \times 10^{20}$ cm$^{-3}$ of the concentration of impurities and p-type source/drain regions 24A and 24B each containing about $1 \times 10^{20}$ cm$^{-3}$ of the concentration of impurities.

It is desired that the duration and temperature of those thermal treatments applicable to respective processes be properly adjusted as required so that the doped impurities can perfectly be activated only after completing the final thermal treatment Next, as shown in FIG. 2H, inter-layer insulation film 26 composed of silicon oxide film or the like is deposited on the entire surface of the device by applying a CVD process for example. Next, by applying a photo-engraving process, contact holes are provided for the predetermined positions of the device. FIG. 2H illustrates that the contact holes 28A and 28B are respectively provided i the direction of the n-type and p-type source/-drain regions 22A and 24B. Next, by applying a sputtering process for example, metal film like aluminium is deposited on the entire surface of the device. Next, the metal film is selectively etched by applying photo-engraving process for example, and finally, metal wire layers 30A and 30B are formed to materialize electrical connection to the n- and p-type source/drain regions 22A and 24B.

After execution of those sequential processes described above, production of the complementary semiconductor device related to the first embodiment is completed.

Materialization of those processes provides a variety of advantages mentioned below in contrast with the formation of the conventional complementary semiconductor device in with silicon film.

Concretely, the above method securely generates conductive regions by selectively doping ionized atoms of either III group or V group into the diamond thin film which is substantially an insulator itself. In consequence, the above method dispenses with formation of element separating regions. In other words, the method embodied by the invention dispenses with the process for forming a field oxide film. Furthermore, the above invented method dispenses with the process for forming a well region otherwise needed for forming an opposite conductive active element in one-way conductive semiconductor. As a result, the diamond-applied complementary semiconductor device can easily be manufactured merely by executing a lesser number of manufacturing processes than needed for the conventional silicon-applied complementary semiconductor device.

The complementary semiconductor device of the first embodiment uses silicon-oxide film for example for the formation of the inter-layer insulation film 26. Nevertheless, it is also possible for the first embodiment to use either PSG, or BSG, or BPSG, or diamond for the formation of the inter-layer insulation film 26. Likewise, not only aluminium, but a variety of conductors may also be available for composing metallic wire layers 30A and 30B as well. Not only tungsten, but a variety of conductors may also be available for composing the gate electrodes 16A through 16C as well.

[Embodiment 2]

Figure 3:
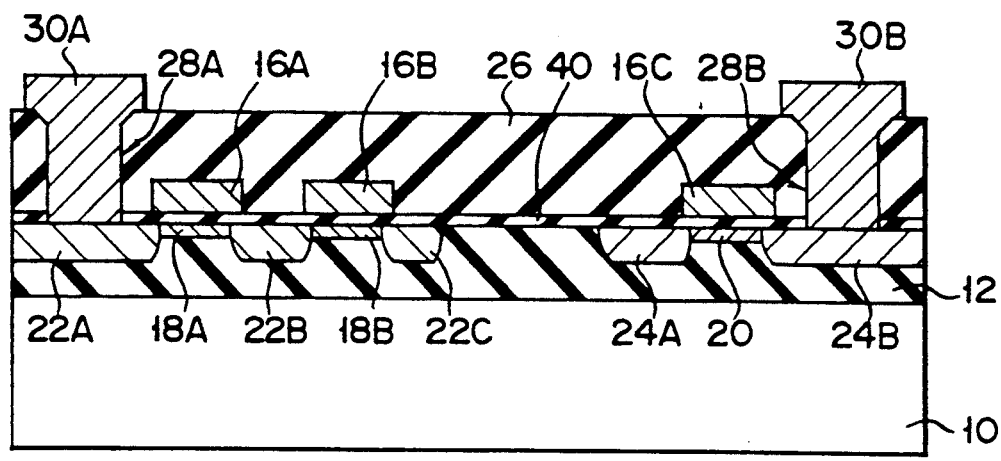
FIG. 3 illustrates a sectional view of a complementary semiconductor device relating to the second embodiment of the invention.

FIG. 3 illustrates the sectional view of the complementary semiconductor device related to the second embodiment of the invention. Those components shown in FIG. 3 identical to those which are shown in FIG. 1 are designated by the identical reference numerals. Only the differences are described below. As shown in FIG. 3, the second embodiment has formed a MISFET incorporating semiconductor made from diamond. More particularly, a gate insulation film 40 is provided between the gate electrodes 16A through 16C and the n- and p-type channel-forming regions 18A, 18B, and 20.

In order to produce the MISFET, about $4 \times 10^{16}$ cm$^{-3}$ of the concentration of impurities should be applied to the formation of the n-type channel forming regions 18A and 18B. Likewise, about $4 \times 10^{16}$ cm$^{-3}$ of the concentration of impurities should be applied to the formation of the p-type channel-forming region 20.

Normally, a depression type n-channel MISFET is formed by applying n-type conductor to the n-type channel-forming regions 18A and 18B. In the same way, normally, a depression type p-channel MISFET is formed by applying p-type conductor to the p-type channel-forming region 20. Normally, an enhancement type MISFET is formed by inverting the conductive types of these channel-forming regions. Accordingly, an enhancement type n-channel MISFET is formed by replacing the n-type channel-forming regions 18A and 18B with the p-type conductor. In the same way, an enhancement type p-channel MISFET is formed by replacing the p-type channel-forming region 20 with the n-type conductor. It is also possible for the first embodiment to employ the method of composing either the enhancement type or the depression type MISFET by selecting the conductor type of the channel forming regions.

Referring now to FIG. 4A through 4H, a preferred method of manufacturing the complementary semiconductor device related to the second embodiment of the invention is described below. FIG. 4A through 4H respectively illustrate the sectional views according to the sequence of the processes for manufacturing the complementary semiconductor device related to the second embodiment. Those components shown in FIGS. 4A through 4H identical to those which are shown in FIGS. 2A through 2H and FIG. 3 are designated by the identical reference numerals.

The method of manufacturing the complementary semiconductor device related to the second embodiment shown in FIG. 4A through 4H is almost identical to the method of manufacturing the complementary semiconductor device of the first embodiment shown in FIG. 2A through 2H, and thus only the differences are described below.

Figure 4A:
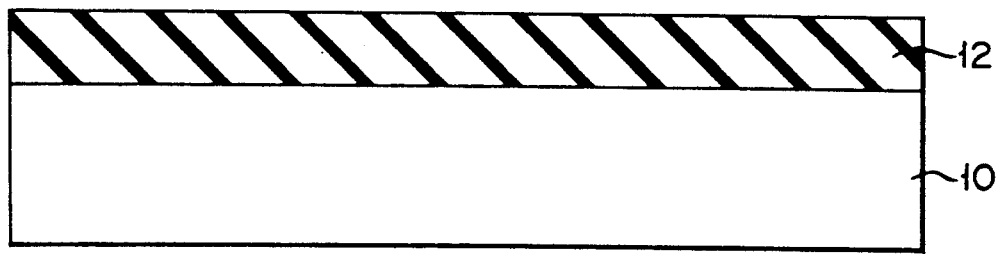
Figure 4B:
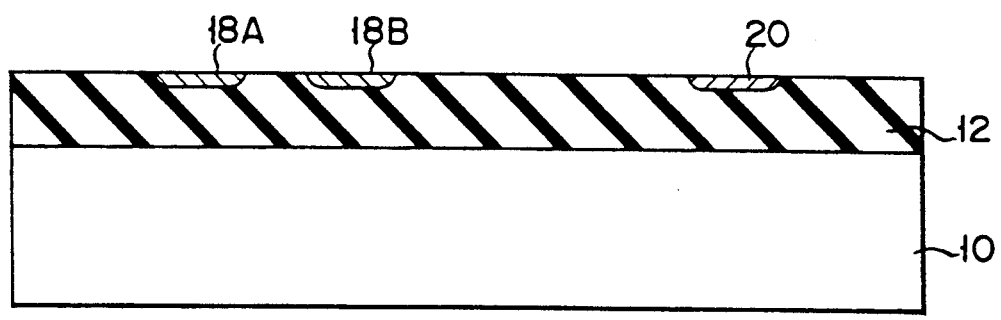
Figure 4F:
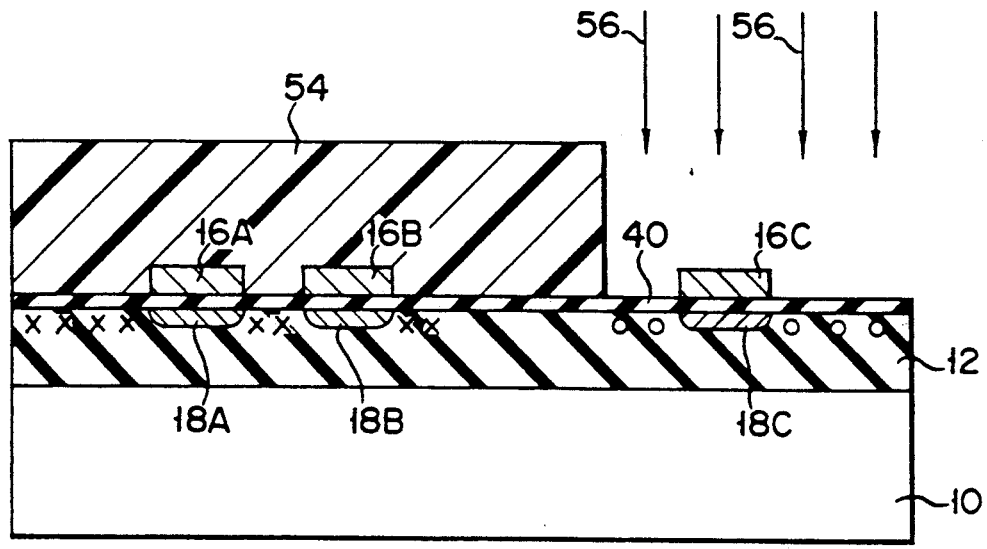
Figure 4G:
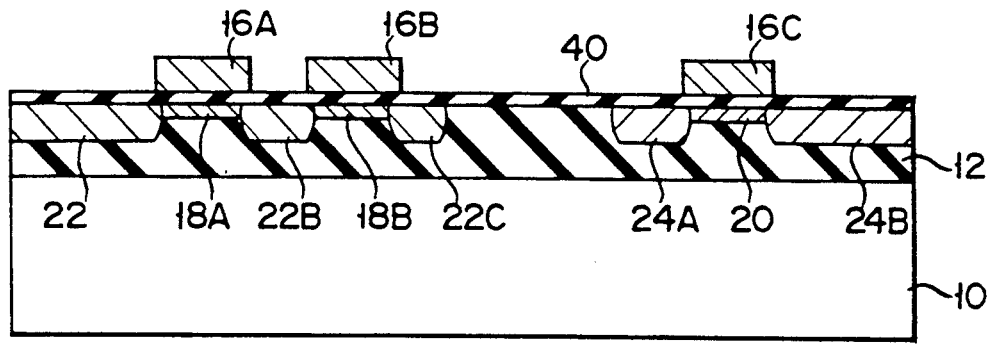
Figure 4H:
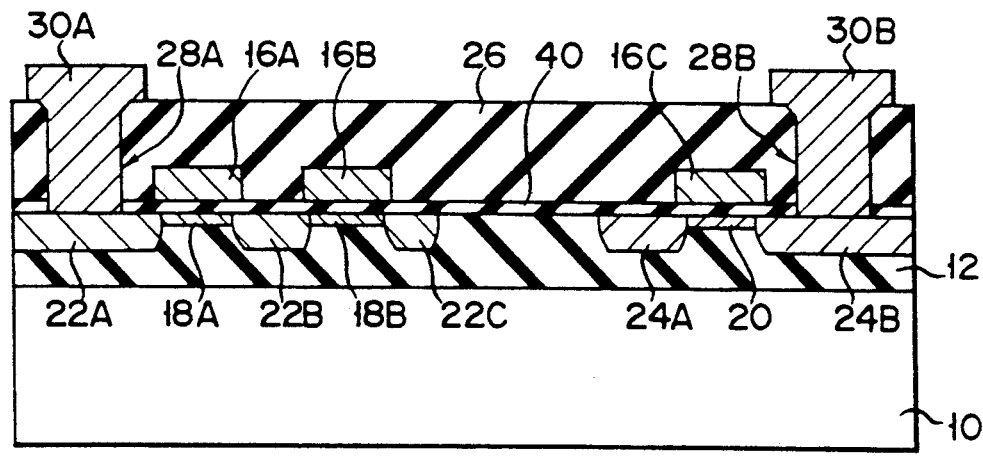

First, when executing the process shown in FIG. 4B, for example, ionized antimony is doped into the n-type channel-forming regions 18A and 18B by applying 20 KeV of accelerated voltage and $10^{12}$ cm$^{-2}$ of the dosed amount. In the same way, ionized boron is doped into the p-type channel-forming region 20 by applying 60 KeV of accelerated voltage and $1 \times 10^{12}$ cm of the dosed amount.

When doping the p-type conductor into the n-type channel-forming regions 18A and 18B, for example, in place of antimony, boron is doped into these regions 18A and 18B. Conversely, when doping the n-type conductor into the p-type channel-forming region 20, for example, in place of boron, antimony is doped into this region 20.

Next, when executing the process shown in FIG. 4C, for example, by applying the microwave plasma CVD process, gate insulation film 40 composed of diamond is brought into propagation over the entire surface of the device until reaching 200Å of thickness.

By executing those modified processes mentioned above, the complementary semiconductor device composed of the MISFET is manufactured based on the second embodiment of the invention. Needless to say that the complementary semiconductor device composed of the MISFET generates a quite satisfactory functional effect comparable to that of the first embodiment.

When doping impurities into the diamond thin film 12 in the course of executing the first and second embodiments, ion doping is applied. However, doping of impurities may also be executed by a applying vapor-phase diffusion method.

The first and second embodiments have respectively a used silicon substrate to allow propagation of the diamond thin film 12 on its surface. However, other materials including insulative material like diamond may also be available for composing the substrate.

Not only by applying silicon oxide film, but the inter-layer insulation film 26 may also be composed of insulative material like diamond or the like as well. For example, considering the presence of a wiring system in the inter-layer insulation film 26 via contact holes 28A and 28B, in order to decrease the parasitic capacitance between the wiring systems, it is desired that silicon oxide film containing less specific dielectric constant than diamond be introduced. Conversely, from the viewpoint of a satisfactory radiation effect, diamond is preferable to silicon oxide film. More particularly, considering those cases in which diamond is made available for composing the inter-layer insulation film and the CVD silicon oxide film, it is also available for composing the inter-layer insulation film as well, both materials are in the "trade-off" relationship in the radiation effect and the parasitic capacitance. Accordingly, when manufacturing the complementary semiconductor device related to the invention, it is desired that, not only those two kinds of insulative materials cited above, but any optimal material also be selected from a variety of insulative materials so that the inter-layer insulation film can properly be composed.

According to the description of the second embodiment of the complementary semiconductor device related to the invention, diamond has been introduced for composing the gate insulative film of the MISFET. Nevertheless, not only diamond, but a variety of insulative films made from oxide film may also be used. However, in order to make the device finer, considering the occurrence of an interfacial level requiring the utmost care, it is desired that diamond be made available for composing the gate insulation film.

Either n-type or p-type may optionally be selected for both the MESFET and the MISFET for determining the conductive type of the channel-forming regions below the gate electrodes.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:
   a substrate having a major surface;
   an insulative diamond thin film formed on the major surface of said substrate and having a major surface facing away from said substrate;
   first and second conductive regions formed in the major surface of said insulating diamond thin film and functioning as channels;
   a first gate located above said first conductive region;
   first insulating means interposed between said first conductive region and said first gate for electrically insulating said first conductive region and said first gate from each other;
   a second gate located above said second conductive region;
   second insulating means interposed between said second conductive region and said second gate for electrically insulating said second conductive region and said second gate from each other;
   a first source region and a first drain region both of a first conductivity type formed in the major surface of said insulative diamond thin film and contacting said first conductive region and isolated from said substrate; and
   a second source region and a second drain region both of a second conductivity type formed in the major surface of said insulative diamond thin film and contacting said second conductive region and isolated from said substrate;
   with said insulative diamond thin film electrically insulating said first source and drain regions from said second source and drain regions.

2. The semiconductor device according to claim 1, wherein said first conductive region is of the first conductivity type, and wherein said second conductive region is of the second conductivity type.

3. The semiconductor device according to claim 2, wherein said first conductive region has an impurity concentration lower than that of said first source and drain regions, and said second conductive region has an impurity concentration lower than that of said second source and drain regions.

4. The semiconductor device according to claim 1, herein said first conductive region is of the second conductivity type, and wherein said second conductive region is of the first conductivity type.

5. The semiconductor device according to claim 1, wherein said first and second insulating means are insulating films formed on the major surface is said insulative diamond thin film.

6. The semiconductor device according to claim 5, wherein said insulating films are made of diamond.

7. The semiconductor device according to claim 1, wherein said insulating means are Schottky junctions.

8. The semiconductor device according to claim 1, further comprising a third conductive region formed in the major surface of said insulative diamond thin film by doping an impurity into said insulative diamond thin film, and functioning as a wiring layer.

* * * * *